(12) United States Patent
Akram

(10) Patent No.: US 7,338,889 B2
(45) Date of Patent: *Mar. 4, 2008

(54) METHOD OF IMPROVING COPPER INTERCONNECTS OF SEMICONDUCTOR DEVICES FOR BONDING

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/791,191

(22) Filed: Mar. 2, 2004

(65) Prior Publication Data

US 2004/0171246 A1    Sep. 2, 2004

Related U.S. Application Data

(62) Division of application No. 10/383,042, filed on Mar. 6, 2003, which is a division of application No. 09/332,665, filed on Jun. 14, 1999, now Pat. No. 6,544,880.

(51) Int. Cl.
*H01L 21/44* (2006.01)

(52) U.S. Cl. .................. 438/612; 438/613; 438/614; 438/615; 438/616; 438/617; 257/E21.476

(58) Field of Classification Search ............ 438/111, 438/123, 612–617, 686–687; 257/E21.476
See application file for complete search history.

(56) References Cited

U.S. PATENT DOCUMENTS

| | | |
|---|---|---|
| 3,648,131 A | 3/1972 | Stuby |
| 3,761,782 A | 9/1973 | Youmans |
| 3,781,596 A | 12/1973 | Galli et al. |
| 4,074,342 A | 2/1978 | Honn et al. |
| 4,182,781 A | 1/1980 | Hooper et al. |
| 4,360,142 A | 11/1982 | Carpenter et al. |
| 4,670,770 A | 6/1987 | Tai |
| 4,709,468 A | 12/1987 | Wilson |
| 4,749,631 A | 6/1988 | Haluska et al. |
| 4,750,666 A | 6/1988 | Neugebauer et al. |
| 4,754,316 A | 6/1988 | Reid |
| 4,756,977 A | 7/1988 | Haluska et al. |
| 4,821,151 A | 4/1989 | Pryor et al. |
| 4,829,014 A | 5/1989 | Yerman |
| 4,866,571 A | 9/1989 | Butt |
| 4,890,157 A | 12/1989 | Wilson |

(Continued)

OTHER PUBLICATIONS

Stanley Wolf, Ph. D. and Richard N. Tauber, Ph. D., *Silicon Processing for the VLSI Era*, vol. 1: Process Technology, pp. 529-534.

*Primary Examiner*—Michael Lebentritt
*Assistant Examiner*—Angel Roman
(74) *Attorney, Agent, or Firm*—TraskBritt

(57) ABSTRACT

An improved wire bond is provided with the bond pads of semiconductor devices and the lead fingers of lead frames or an improved conductive lead of a TAB tape bond with the bond pad of a semiconductor device. More specifically, an improved wire bond is described wherein the bond pad on a surface of the semiconductor device comprises a layer of copper and at least one layer of metal and/or at least a barrier layer of material between the copper layer and one layer of metal on the copper layer to form a bond pad.

7 Claims, 17 Drawing Sheets

U.S. PATENT DOCUMENTS

| | | |
|---|---|---|
| 4,906,341 A | 3/1990 | Yamakawa et al. |
| 4,967,260 A | 10/1990 | Butt |
| 4,970,571 A | 11/1990 | Yamakawa et al. |
| 4,985,310 A | 1/1991 | Agarwala et al. |
| 5,014,159 A | 5/1991 | Butt |
| 5,023,202 A * | 6/1991 | Long et al. .................. 29/827 |
| 5,057,461 A * | 10/1991 | Fritz ........................... 29/827 |
| 5,058,798 A | 10/1991 | Yamazaki et al. |
| 5,059,553 A | 10/1991 | Berndlmaier et al. |
| 5,095,402 A | 3/1992 | Hernandez et al. |
| 5,106,461 A | 4/1992 | Volfson et al. |
| 5,128,737 A | 7/1992 | van der Have |
| 5,137,845 A | 8/1992 | Lochon et al. |
| 5,169,680 A | 12/1992 | Ting et al. |
| 5,198,684 A | 3/1993 | Sudo |
| 5,217,922 A | 6/1993 | Akasaki et al. |
| 5,219,117 A | 6/1993 | Lin |
| 5,224,265 A | 7/1993 | Dux et al. |
| 5,235,212 A | 8/1993 | Shimizu et al. |
| 5,246,880 A | 9/1993 | Reele et al. |
| 5,268,072 A | 12/1993 | Agarwala et al. |
| 5,293,006 A | 3/1994 | Yung |
| 5,298,793 A | 3/1994 | Kotani et al. |
| 5,323,051 A | 6/1994 | Adams et al. |
| 5,327,013 A | 7/1994 | Moore et al. |
| 5,331,235 A | 7/1994 | Chun |
| 5,336,928 A | 8/1994 | Neugebauer et al. |
| 5,343,064 A | 8/1994 | Spangler et al. |
| 5,367,195 A | 11/1994 | DiGiacomo et al. |
| 5,371,654 A | 12/1994 | Beaman et al. |
| 5,376,584 A | 12/1994 | Agarwala |
| 5,381,946 A | 1/1995 | Koopman et al. |
| 5,404,265 A | 4/1995 | Moresco et al. |
| 5,424,245 A | 6/1995 | Gurtler et al. |
| 5,436,411 A | 7/1995 | Pasch |
| 5,449,314 A | 9/1995 | Meikle et al. |
| 5,455,459 A | 10/1995 | Fillion et al. |
| 5,468,681 A | 11/1995 | Pasch |
| 5,470,787 A | 11/1995 | Greer |
| 5,478,007 A | 12/1995 | Marrs |
| 5,480,835 A | 1/1996 | Carney et al. |
| 5,481,135 A | 1/1996 | Chandra et al. |
| 5,485,038 A | 1/1996 | Licari et al. |
| 5,486,721 A | 1/1996 | Herklotz et al. |
| 5,489,804 A | 2/1996 | Pasch |
| 5,491,612 A | 2/1996 | Nicewarner, Jr. |
| 5,492,863 A | 2/1996 | Higgins, III |
| 5,493,437 A | 2/1996 | Lebby et al. |
| 5,495,667 A | 3/1996 | Farnworth et al. |
| 5,497,033 A | 3/1996 | Fillion et al. |
| 5,502,002 A | 3/1996 | Wong et al. |
| 5,503,286 A | 4/1996 | Nye, III et al. |
| 5,505,366 A | 4/1996 | Nishi et al. |
| 5,521,432 A | 5/1996 | Tsuji et al. |
| 5,536,362 A * | 7/1996 | Love et al. .................. 216/13 |
| 5,547,906 A | 8/1996 | Badehi |
| 5,550,083 A | 8/1996 | Koide et al. |
| 5,561,320 A | 10/1996 | Abbott et al. |
| 5,581,498 A | 12/1996 | Ludwig et al. |
| 5,604,379 A | 2/1997 | Mori |
| 5,635,766 A | 6/1997 | Cain |
| 5,665,639 A | 9/1997 | Seppala et al. |
| 5,670,826 A | 9/1997 | Bessho et al. |
| 5,672,548 A | 9/1997 | Culnane et al. |
| 5,677,576 A | 10/1997 | Akagawa |
| 5,682,065 A | 10/1997 | Farnworth et al. |
| 5,684,677 A | 11/1997 | Uchida et al. |
| 5,719,448 A | 2/1998 | Ichikawa |
| 5,736,456 A | 4/1998 | Akram |
| 5,848,467 A * | 12/1998 | Khandros et al. ............. 29/841 |
| 5,904,859 A | 5/1999 | Degani |
| 5,909,633 A * | 6/1999 | Haji et al. .................. 438/612 |
| 6,002,177 A | 12/1999 | Gaynes et al. |
| 6,083,820 A | 7/2000 | Farnworth |
| 6,100,194 A | 8/2000 | Chan et al. |
| 6,130,141 A | 10/2000 | Degani et al. |
| 6,133,070 A | 10/2000 | Yagi et al. |
| 6,150,713 A | 11/2000 | Park et al. |
| 6,159,769 A | 12/2000 | Farnworth et al. |
| 6,164,523 A | 12/2000 | Fauty et al. |
| 6,175,160 B1 | 1/2001 | Paniccia et al. |
| 6,180,505 B1 | 1/2001 | Uzoh |
| 6,187,680 B1 | 2/2001 | Costrini et al. |
| 6,191,493 B1 | 2/2001 | Yasunaga et al. |
| 6,218,281 B1 | 4/2001 | Watanabe et al. |
| 6,271,107 B1 | 8/2001 | Massingill et al. |
| 6,336,928 B1 | 1/2002 | Guerin et al. |
| 6,337,522 B1 | 1/2002 | Kang et al. |
| 6,376,353 B1 | 4/2002 | Zhou et al. |
| 6,397,459 B2 | 6/2002 | Ohshima et al. |
| 6,417,088 B1 | 7/2002 | Ho et al. |
| 6,457,234 B1 | 10/2002 | Edelstein et al. |
| 6,544,880 B1 | 4/2003 | Akram |
| 6,835,643 B2 * | 12/2004 | Akram ........................ 438/612 |
| 2003/0042588 A1 * | 3/2003 | Ushijima et al. ............ 257/684 |
| 2003/0143830 A1 * | 7/2003 | Akram ........................ 438/612 |
| 2005/0023651 A1 * | 2/2005 | Kim et al. ................... 257/666 |
| 2005/0048696 A1 * | 3/2005 | Slemmons et al. ........... 438/106 |
| 2005/0212128 A1 * | 9/2005 | Akram ........................ 257/735 |

\* cited by examiner

METHOD OF IMPROVING COPPER INTERCONNECTS OF SEMICONDUCTOR DEVICES FOR BONDING

CROSS-REFERENCE TO RELATED APPLICATIONS

This application is a divisional of application Ser. No. 10/383,042, filed Mar. 6, 2003, pending, which is a divisional of application Ser. No. 09/332,665, filed Jun. 14, 1999, now U.S. Pat. No. 6,544,880, issued Apr. 8, 2003.

BACKGROUND OF THE INVENTION

1. Field of the Invention

The present invention relates to improved bonding of conductors with the bond pads of semiconductor devices, such as the bonding of wires to the bond pads of semiconductor devices and lead frames associated therewith or the bonding of the conductive leads in TAB tape bonding to the bond pads of semiconductor devices. More specifically, the present invention relates to improved bonds with copper bond pads of semiconductor devices, such as wire bonding or improved conductive lead bonding of TAB tape to the copper bond pads of semiconductor devices.

2. State of the Art

In semiconductor device manufacture, a single semiconductor die (or chip) is typically mounted within a sealed package. In general, the package protects the semiconductor die from damage and from contaminants in the surrounding environment. In addition, the package provides a substantial lead system for connecting the electrical devices formed on the die to a printed circuit board or any other desired suitable external circuitry.

Each semiconductor die comprises a substrate having a lower surface (commonly referred to as the back of the die) that is devoid of circuitry and an upper surface (commonly referred to as the active surface or face of the die) having integrated circuitry constructed thereon. The integrated circuitry is electrically accessible via bond pads located on the active surface of the semiconductor die which may be arranged in a wide variety of patterns, such as around the periphery of the semiconductor die, the center of the semiconductor die, or both, etc.

One of the problems associated with the decreasing size of the semiconductor die and the increasing amount of circuitry included in the semiconductor die is the need to, at least, maintain the speed at which the semiconductor die operates and, if possible, to increase the operating speed of the semiconductor die. Since aluminum is typically used as the material for the connecting circuits of the die with smaller circuit line widths of aluminum, it is difficult to maintain or increase the speed of the semiconductor die. Further, it is necessary to connect an ever-increasing number of bond pads on the active surface of the semiconductor die with an ever-increasing number of lead fingers of the lead frame or other type conductors, such as the conductive leads of TAB tape. In each instance, the use of a more conductive material for the connecting circuits of the semiconductor die connecting to the bond pads on the active surface of the semiconductor die is required.

In an effort to increase the operating speeds of semiconductor dice using small width circuit lines, improved techniques and processes have been developed to substitute the metal copper for aluminum in the circuit lines of the semiconductor die. However, the use of copper for circuit lines and bond pads of the semiconductor die causes problems when wire bonds are used to connect the copper bond pads of the semiconductor die to the leads of a lead frame or the conductive leads of TAB tape. It is difficult to form wire bond connections using standard or conventional wire bonding equipment when forming wire bonds to connect the copper bond pads of a semiconductor die to the leads of a lead frame.

Typically, the initial component in the packaging process is a lead frame. The lead frame is a metal frame which supports the semiconductor die for packaging and provides the leads for the final semiconductor package. A typical lead frame strip is produced from metal sheet stock (usually a copper, copper alloy, alloy 42, etc.) and is adapted to mount the semiconductor die.

A conventional lead frame has the semiconductor die adhesively mounted on a die paddle of the lead frame while the lead fingers (leads) extend around the periphery of the semiconductor die (the edges) terminating adjacent thereto. Subsequently, wire bonds are made to connect the bond pads on the active surface of the semiconductor die to the appropriate lead finger of the lead frame. After the wire bonding operation, the lead frame and semiconductor die are encapsulated in a transfer die molding process. After encapsulation, the lead frame is trimmed with the remainder of the individual lead fingers being formed into the desired packaging configuration.

One of the problems associated with conventional lead frame configurations is that with the decreasing size of the semiconductor die and the increasing amount of circuitry included in the semiconductor die, it is necessary to connect an ever-increasing number of bond pads on the active surface of the semiconductor die with an ever-increasing number of lead fingers of the lead frame. This requires that the bond pads on the semiconductor die be located on smaller pitch spacings and the width of the lead fingers be smaller. This, in turn, leads to smaller wire bonds on both the bond pads of the semiconductor die and the lead fingers of the lead frame, which causes the wire bonds to be more highly stressed by the forces placed on them. This stress placed on the wire bonds requires that the metal of the bond pad, to which the wire bond is to be made, be highly susceptible to wire bonding and the formation of high strength wire bonds therewith when using well-known wire material, such as gold, etc., and standard or conventional wire bonding equipment.

In a Leads-Over-Chip (LOC) type lead frame configuration for an integrated circuit semiconductor device, the lead fingers of the lead frame extend over the active surface of the semiconductor die being insulated therefrom by tape which is adhesively bonded to the active surface of the semiconductor die and the bottom of the lead fingers. In this manner, the semiconductor die is supported directly from the lead fingers of the lead frame. Electrical connections are made between the lead fingers of the lead frame and the bond pads on the active surface of the semiconductor die by way of wire bonds extending therebetween. After wire bonding, the lead frame and semiconductor die are encapsulated in suitable plastic material. Subsequently, the lead fingers are trimmed and formed to the desired configuration to complete the packaged semiconductor device assembly.

One of the shortcomings of the prior art LOC semiconductor die assemblies is that the tape used to bond to the lead fingers of the lead frame does not adequately lock the lead fingers in position for the wire bonding process. At times, the adhesive on the tape is not strong enough to fix or lock the lead fingers in position for wire bonding as the lead fingers pull away from the tape before wire bonding. Alternatively, the lead fingers will pull away from the tape after wire bonding of the semiconductor die but before encapsulation of the semiconductor die and lead frame, either causing shorts between adjacent wire bonds or causing the wire bonds to pull loose from either the bond pads of the semiconductor die or lead finger of the lead frame. As before with conventional lead frames, with the decreasing size of the semiconductor die and the increasing amount of circuitry included in the semiconductor die, it is necessary to connect an ever-increasing number of bond pads on the active surface of the semiconductor die with an ever-increasing number of lead fingers of the lead frame. This requires that the bond pads on the semiconductor die be located on smaller pitch spacings and the width of the lead fingers be smaller. This, in turn, leads to smaller wire bonds on both the bond pads and the lead fingers of the lead frame, which cause the wire bonds to be more highly stressed by the forces placed on them.

Therefore, when using copper as the metal for the formation of circuits and bond pads of a semiconductor die, a need exists for increased-strength wire bonds between the lead fingers of a lead frame and the bond pads of a semiconductor die or between the conductive leads of TAB tape and the bond pads of a semiconductor die, particularly as the size of the semiconductor die, the size of the bond pads thereon, the size of the lead fingers connected by wire bonds to bond pads, and the pitch thereof, all decrease.

It is known in the art to form bumps on the bond pads of a semiconductor die using wire bonding apparatus for subsequent wire bond Tape Automated Bonding (TAB) or flip-chip (face-down) assembly of a bare chip die to a substrate. Such is illustrated in U.S. Pat. Nos. 4,750,666 and 5,058,798. It is also known to repair defective or broken wire bonds to bond pads of a semiconductor die by forming a flattened pad over the remaining portion of the wire and, subsequently, bonding the end of another wire thereover. Such is illustrated in U.S. Pat. No. 5,550,083. Other types of wire bonding operations on the bond pads of a semiconductor die are illustrated in U.S. Pat. Nos. 5,235,212, 5,298,793, 5,343,064, 5,371,654, and 5,492,863. However, such patents use aluminum for the circuits and bond pads of the semiconductor die rather than copper, which is difficult to make effective bonds thereto using conventional processes and equipment.

BRIEF SUMMARY OF THE INVENTION

The present invention relates to improved wire bonds with the bond pads of semiconductor devices and either the lead fingers of lead frames or the conductive leads of TAB tape. More specifically, the present invention relates to improved wire bonds and improved conductive lead bonds of TAB tape to the bond pads of a semiconductor device wherein the bond pads comprise a copper layer and at least one layer of metal covering a portion of the copper layer.

BRIEF DESCRIPTION OF THE SEVERAL VIEWS OF THE DRAWINGS

In the drawings, which illustrate what is currently considered to be the best mode for carrying out the invention.

The present invention will be better understood when the drawings are taken in conjunction with the following description of the invention.

DETAILED DESCRIPTION OF THE INVENTION

Figure 1:
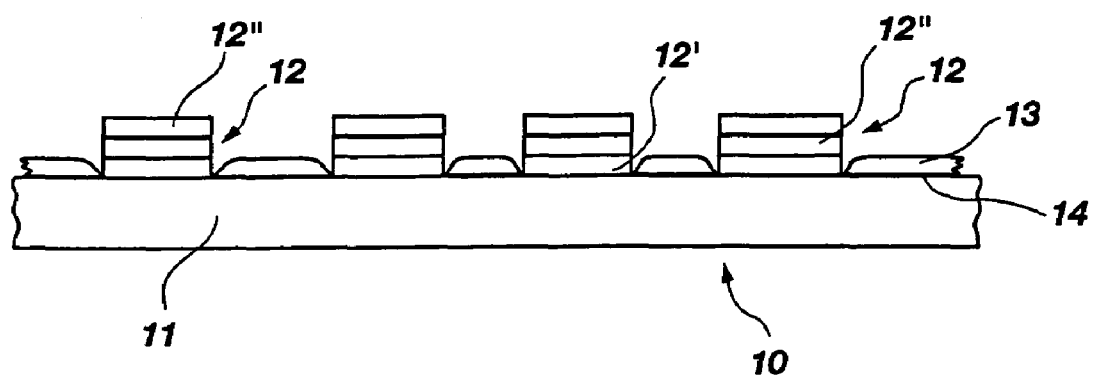
FIG. 1 is a cross-sectional view of a portion of a semiconductor die having a plurality of copper bond pads thereon having one or more layers of metal thereon.

Referring to drawing FIG. 1, a portion of a semiconductor device 10 is illustrated having a plurality of bond pads 12 located on the active surface 14 of a semiconductor device 10 having a layer of insulating material 13, and a passivation layer, thereon. The semiconductor device 10 may be of any desired type having any desired configuration of bond pads 12 connected to the active circuitry therein. As illustrated, bond pads 12 include a copper metal layer base 12' and one or more additional metal layers 12" thereon to facilitate the formation of an acceptable wire bond using well-known alloys of metal for the wire to the bond pads 12. The wire bond may be formed or secured to the bond pads 12 by any desired, well-known wire bonding apparatus used in the industry using any desired type of wire, such as aluminum, copper, copper alloy, aluminum-copper alloy, gold, silver, gold-silver alloy, platinum, etc., although gold wire is preferred to be used as gold does not form an oxide after the deposition thereof on the bond pad 12 as would aluminum, silver, etc.

As necessary, the bond pad 12 may be comprised of layers of different metals to enhance bonding characteristics. For instance, layer base 12' is of copper metal such as is used for the circuits of the semiconductor device 10, i.e., copper metal, a copper alloy, etc. Typically, the layer 12" would be of gold, gold alloy, silver, silver alloy, palladium and alloys thereof, noble metals and alloys thereof, nickel and alloys thereof, nickel and gold alloys, zincated copper, etc. The layer 12" may further include an additional intermediate layer of metal or other materials to help prevent intermetallic compounds from forming between the copper layer base 12' and layer 12" and/or for adhesion purposes. For instance, the layer 12" may commonly comprise a layer of TaN, TIN, Ni alloys, etc. If a gold wire is used for wire bonding, the metal layer 12" may typically be a gold or gold alloy metal layer. In this manner, by forming the bond pad 12 of multiple layers of metal, a strong bond between the wire used for wire bonding and the copper metal layer base 12' of the bond pad 12 may be formed, particularly since gold does not form an oxide coating after the deposition thereof to affect any subsequent bond of material thereto. If desired, one layer of the metal layer 12" of multiple metal layers 12" may be a layer of metal forming a barrier to prevent any copper from the layer base 12' from migrating therethrough or any metal of the metal layer 12" from migrating to the copper layer base 12'. Additionally, one layer of the metal layer 12" may be a layer of metal for adhesion promoting purposes to either the copper layer base 12' or the metal layer 12".

Figure 2A:
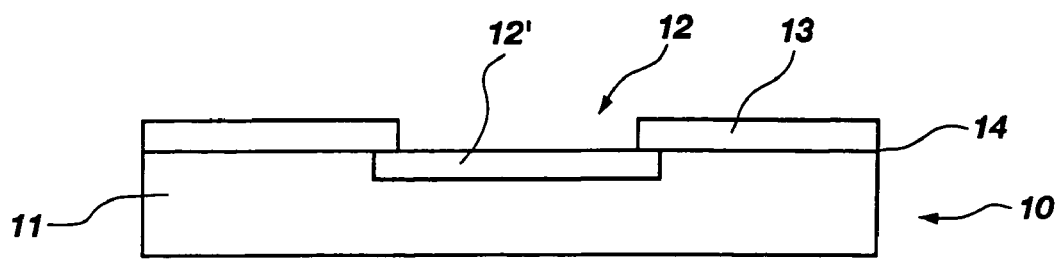
FIGS. 2A through 2F are views of a portion of a semiconductor device having a bond pad of the present invention located thereon having a wire bond formed thereon.
Figure 2B:
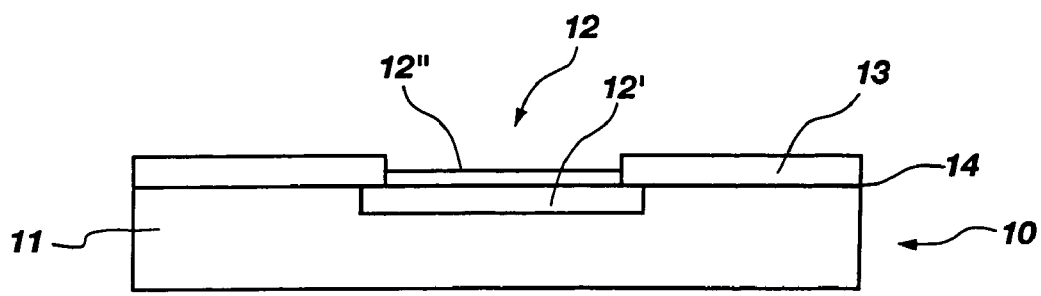
Figure 2C:
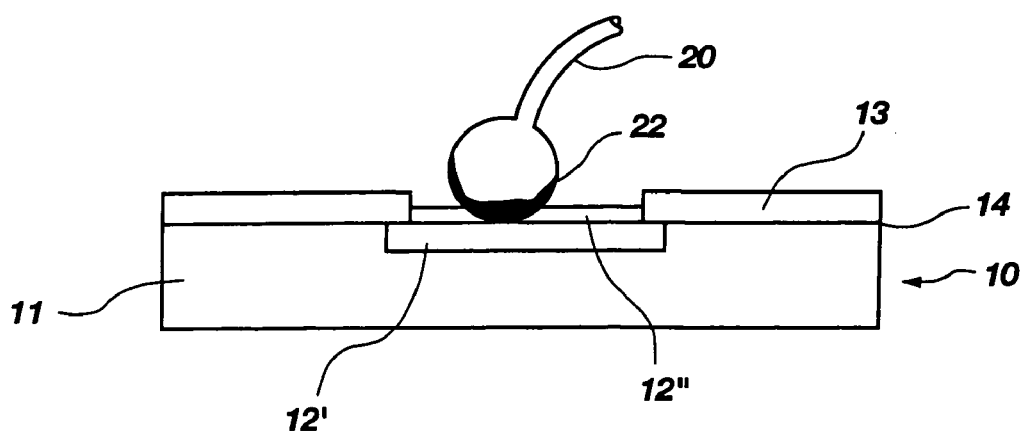

Referring to drawing FIGS. 2A through 2C, a process for forming multi-layer bond pads 12 on the active surface 14 of substrate 11 is illustrated. A portion of a semiconductor device 10 is shown in drawing FIG. 2A having a copper layer base 12' forming a portion of the bond pad 12. Illustrated in drawing FIG. 2B, is a layer of metal 12" overlying the copper layer base 12' of the bond pad 12. The layer of metal 12" may be selectively plated by well-known techniques over the copper layer base 12', the layer of metal 12" having good properties for the wire bonding of a wire 20 to the bond pad 12. Illustrated in drawing FIG. 2C, a wire 20 is bonded by well-known wire bonding apparatus to the layer of metal 12" of the bond pad 12 using a wire bond ball 22.

Still referring to drawing FIGS. 2A through 2C, a portion of a semiconductor device 10 is shown having a bond pad 12 thereon with the copper layer base 12' located thereon having the upper surface thereof located at approximately the same level as the active surface 14 of substrate 11 of the semiconductor device 10, the active surface 14 having a layer of insulating material 13 (typically a passivation layer of an insulating oxide or insulating nitride) thereon. As illustrated in drawing FIG. 2B, the copper layer base 12' of bond pad 12 has a suitable metal layer 12" selectively plated thereon using well-known plating processes, the function of the metal layer 12" being to provide a good metal to which an effective wire bond may be formed using well-known wire bonding apparatus.

Illustrated in drawing FIG. 2C, a wire 20 is wire bonded to metal layer 12" using a ball 22 formed on the end of the wire 20 using any well-known suitable wire bonding apparatus. In the wire bonding process, the portion of the metal layer 12" on the bond pad 12 located under ball 22 of the wire 20 of the wire bond thereto may be consumed during the wire bonding process, thereby allowing the ball 22 of the wire 20 of the wire bond to make direct contact with the copper layer base 12' of the bond pad 12. For example, when the metal layer 12" is gold and the ball 22 of wire 20 is gold wire, the metal layer 12" located under the ball 22 will become part of the ball 22 during the wire bonding process with the ball 22 being bonded to the copper layer base 12' of the bond pad 12.

Figure 2D:
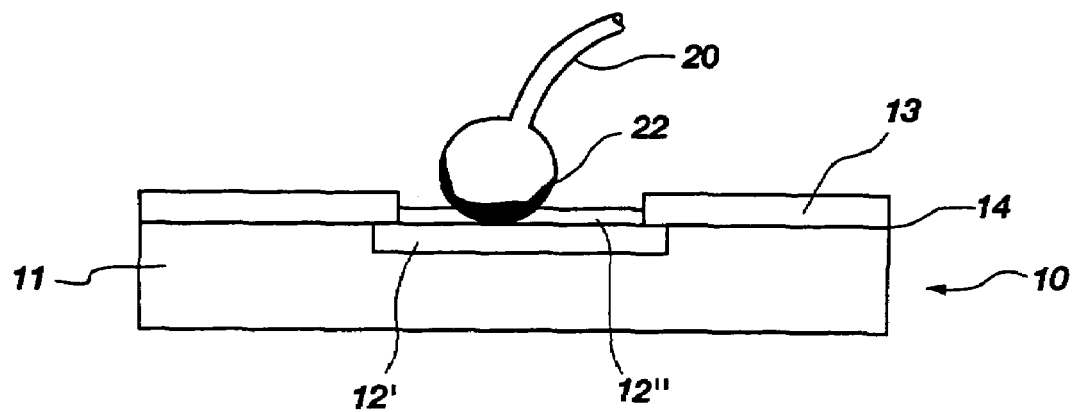

Referring to drawing FIG. 2D, a wire 20 is wire bonded to copper layer base 12' with the ball 22 on the end of wire 20 consuming or adding part of the metal layer 12" during the bonding process forming the ball 22 on the end of wire 20 connecting the wire 20 to the copper layer base 12'.

Figure 2E:
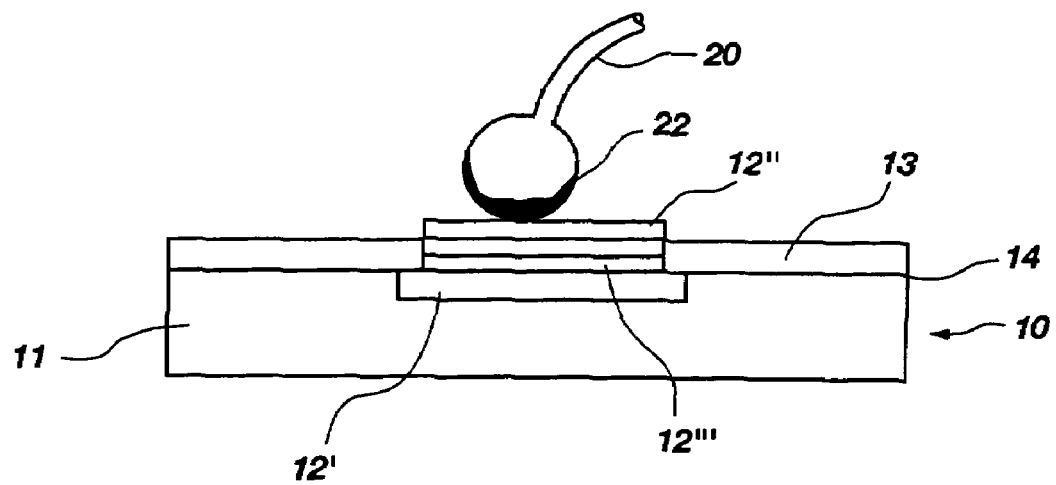

Referring to drawing FIG. 2E, a portion of a semiconductor device 10 is shown having a bond pad 12 thereon with the copper layer base 12' located thereon having the upper surface thereof located at approximately the same level as the active surface 14 of substrate 11 of the semiconductor device 10, the active surface 14 having a layer of insulating material 13 (typically a passivation layer of an insulating oxide or insulating nitride) thereon. As illustrated in drawing FIG. 2E, the copper layer base 12' of bond pad 12 has a barrier layer 12''' formed of a suitable material having a suitable metal layer 12" selectively plated thereon using well-known plating processes. The function of the barrier layer 12''' is to help prevent interaction between the copper layer base 12' and the suitable metal layer 12" of the bond pad 12 and/or to help prevent or decrease the growth of intermetallic between the copper layer base 12' and the metal layer 12". For instance, barrier materials, such as titanium, tungsten, tantalum, nickel, tantalum-nickel alloys, titanium-nickel alloys, titanium-tungsten alloys, etc., are frequently used in conjunction with aluminum alloy interconnects. In other instances, a barrier layer of nickel between copper and tin will decrease the growth of tin-copper intermetallic. The layers of metal forming the bond pads 12 also occasionally are silicided, or have a refractory interconnect material, such as molybdenum, tungsten, or tungsten silicide, as part thereof. The function of the metal layer 12" is to provide a good metal to which an effective wire bond may be formed using well-known wire bonding apparatus, such as a metal layer 12" of gold when a gold wire 20 is being used for wire bonding.

Figure 2F:
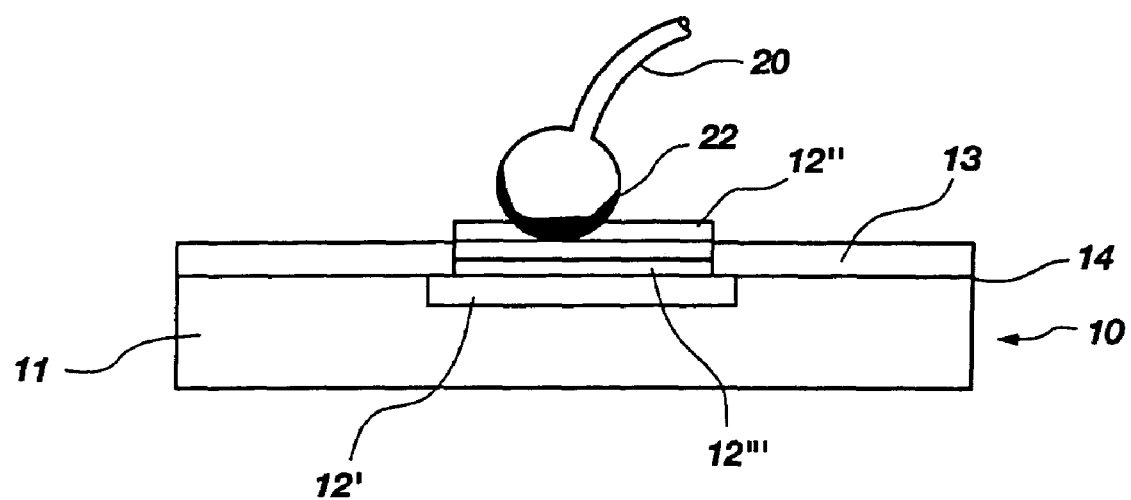

Referring to drawing FIG. 2F, a wire 20 is wire bonded to barrier layer 12''' with the ball 22 on the end of wire 20 consuming part of the metal layer 12" during the bonding process forming the ball 22 on the end of wire 20 connecting the wire 20 to the barrier layer 12'''.

Figure 3A:
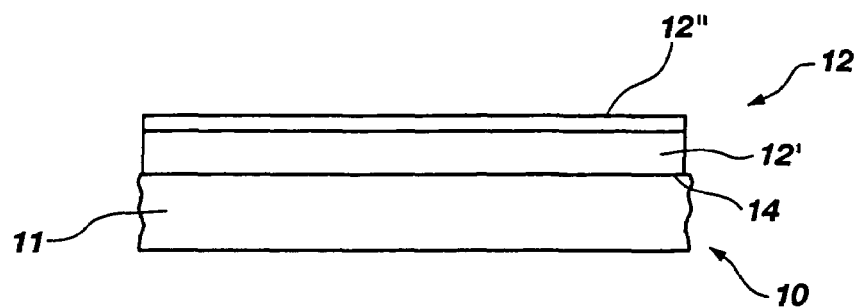
FIGS. 3A through 3C are views of a portion of a semiconductor device illustrating the formation of a bond pad thereon of the present invention having a wire bond formed thereon.
Figure 3B:
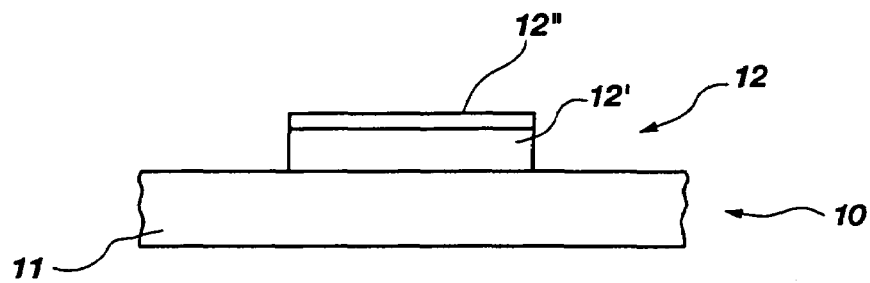
Figure 3C:
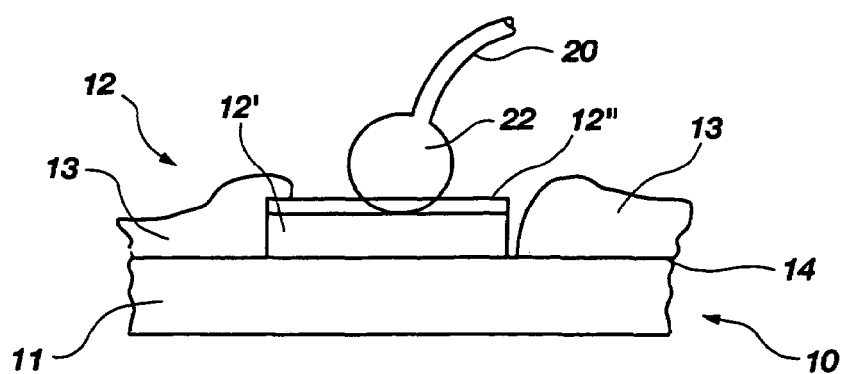

Referring to drawing FIGS. 3A through 3C, a portion of a semiconductor device 10 is shown wherein a copper layer base 12' is deposited on the substrate 11 using any desired well-known process having a thin layer of metal 12", as described hereinbefore, deposited thereon. The thin layer of metal 12" may be deposited on the copper layer base 12' by any well-known process, such as sputter deposition, electrodeposition, electroless deposition, etc.

Referring to drawing FIG. 3B, the portion of the semiconductor device 10 is shown after the copper layer base 12' and layer of metal 12" deposited thereon have been patterned using well-known techniques to apply a photoresist in a desired pattern with the subsequent etching of the copper layer base 12' and layer of metal 12" to form a bond pad 12 on the substrate 11 of the semiconductor device 10. The copper layer base 12' and layer of metal 12" deposited thereon may be any desired shape, size, and number for the desired number of bond pads 12 on the substrate 11. Further, the copper layer base 12' may include at least two or more layers of metal with the upper layer being a copper layer, thereby forming a stack of layers of differing metal with the upper layer being a copper layer.

Referring to drawing FIG. 3C, a portion of the semiconductor device 10 is shown having a wire 20 bonded to the layer of metal 12" of the bond pad 12 using a ball 22 type bond thereto for wire bonding using any desired well-known wire bonding apparatus. The semiconductor substrate 11 includes a layer of insulating material 13, as described hereinbefore, on active surface 14 thereof surrounding the bond pad 12.

Figure 4A:
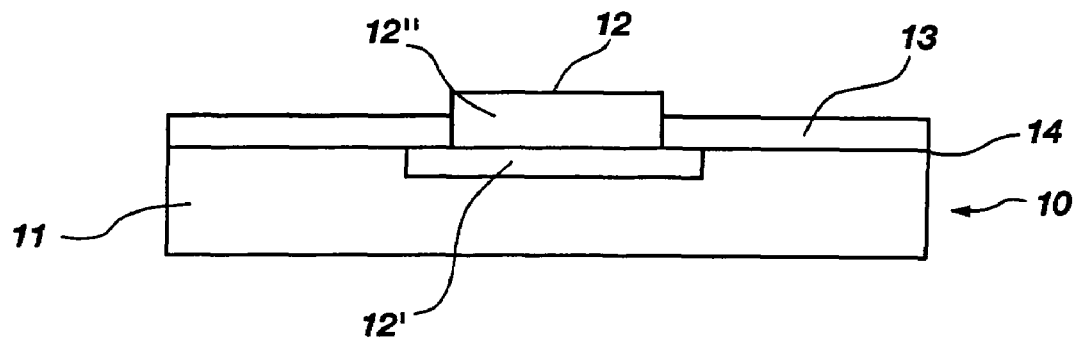
FIGS. 4A through 4D are views of a portion of a semiconductor device having a bond pad of the present invention located thereon with a conductive lead of a TAB tape bonded thereto.

Referring to drawing FIGS. 4A through 4D, in drawing FIG. 4A, a portion of a semiconductor device 10 is shown having a bond pad 12 thereon with the copper layer base 12' located thereon having the upper surface thereof located at approximately the same level as the active surface 14 of substrate 11 of the semiconductor device 10, the active surface 14 having a layer of insulating material 13 (typically a passivation layer of an insulating oxide or insulating nitride) thereon. Also illustrated in drawing FIG. 4A, the copper layer base 12' of bond pad 12 has a suitable metal layer 12" selectively plated thereon using well-known nailing processes. The function of the metal layer 12" is to provide a good metal to which an effective wire bond may be formed using well-known wire bonding apparatus.

Figure 4B:
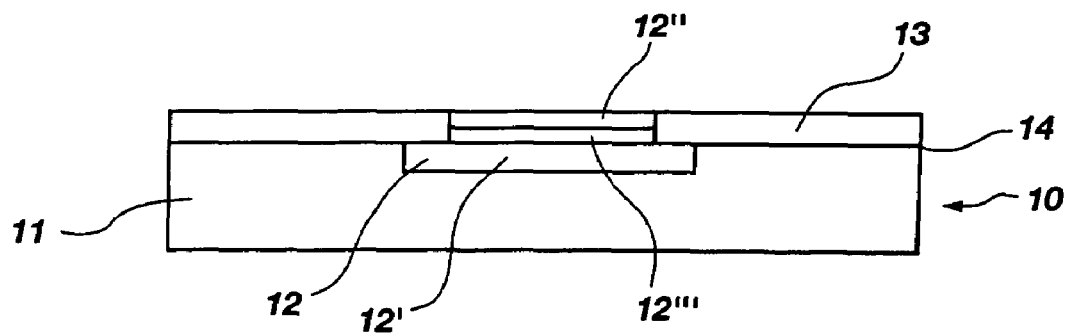

Illustrated in drawing FIG. 4B, the copper layer base 12' of bond pad 12 has a suitable barrier layer 12''' located between the copper layer base 12' and the suitable metal layer 12", such as described hereinbefore.

Figure 4C:
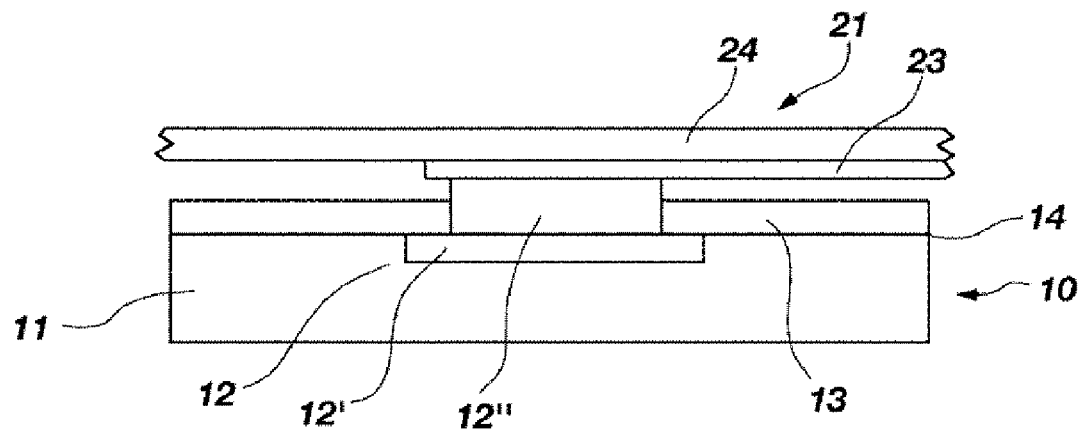

Referring to drawing FIG. 4C, a portion of a semiconductor device 10 is shown having a bond pad 12 thereon having a copper layer base 12' located thereon having a portion bonded thereto of a conductive lead 23 located on a portion of a substrate 24 of a portion of a TAB tape 21. The active surface 14 of substrate 11 of the semiconductor device 10 has a layer of insulating material 13 (typically a passivation layer of an insulating oxide or insulating nitride) thereon. Also illustrated in drawing FIG. 4C, the function of the metal layer 12" is to provide a good metal to which an effective bond may be formed using well-known bonding apparatus to bond the conductive lead 23 of the TAB tape 21. The conductive lead 23 of the TAB tape 21 may be of any suitable metal, such as copper, copper alloys, etc. The metal layer 12" maybe of any suitable metal, such as described herein.

Figure 4D:
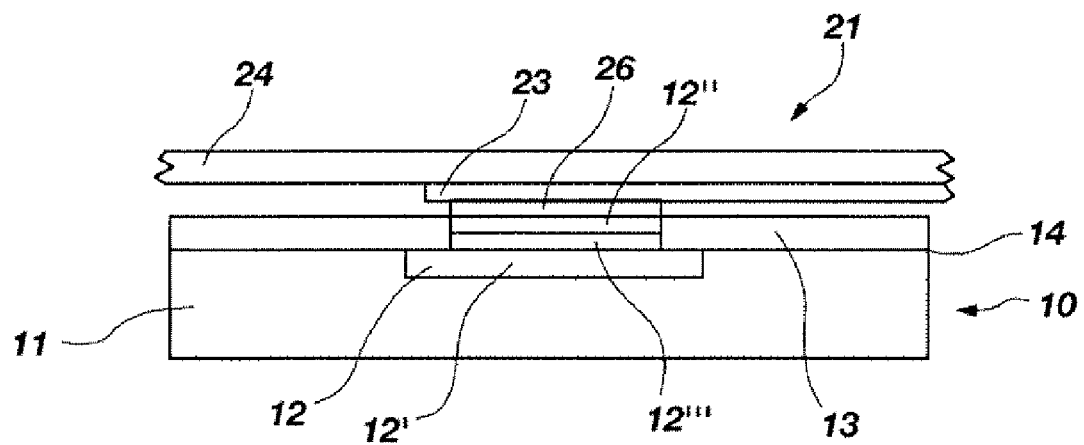

Referring to drawing FIG. 4D, a portion of a semiconductor device 10 is shown having a bond pad 12 thereon having a copper layer base 12' located thereon having a barrier layer 12''' located thereon having, in turn, a metal layer 12" located thereon. The metal layer 12" of the bond pad 12 is bonded to a portion of a conductive lead 23 located on a portion of a substrate 24 of a portion of a TAB tape 21. The conductive lead 23 of the portion of the TAB tape 21 includes a layer 26 of suitable metal located thereon for the bonding of the conductive lead 23 to the metal layer 12" of the bond pad 12 of the semiconductor device 10. The active surface 14 of substrate 11 of the semiconductor device 10 has a layer of insulating material 13 (typically a passivation layer of an insulating oxide or insulating nitride) thereon. Also illustrated in drawing FIG. 4D, the function of the metal layer 12" is to provide a good metal to which an effective bond may be formed using well-known bonding apparatus to the metal layer 26 of the conductive lead 23 of the TAB tape 21. The substrate 24 and metal layer 26 may be of any suitable metal for bonding purposes, such as gold, alloys of gold, etc. The conductive lead 23 of the TAB tape 21 may be of any suitable metal, such as copper, copper alloys, etc. The metal layer 12" may be of any suitable metal, such as described herein. The barrier layer 12''' may be of any suitable metal or material, such as described herein.

Referring to drawing FIGS. 5A through 5J, various differing processes for the formation of the bond pad 12 including a copper layer base 12' and a layer of metal 12" and, if desired, a barrier layer 12''' are illustrated.

Figure 5A:
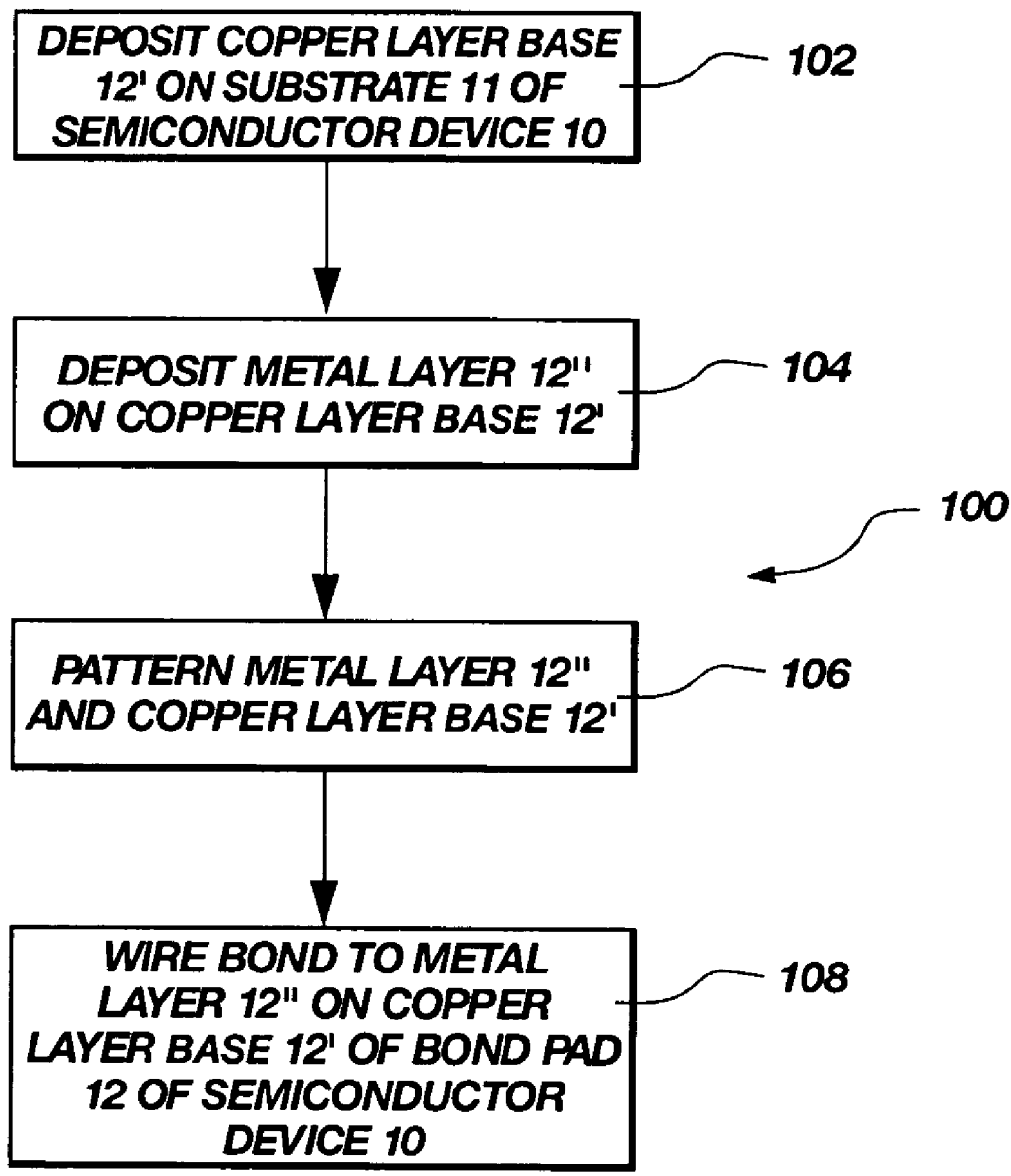
FIGS. 5A through 5J are drawings illustrating processes of forming a bond pad of the present invention on a semiconductor device and a subsequent wire bond and bonding of a conductive lead of a TAB tape therewith.

Referring to drawing FIG. 5A, a process 100 for the formation of a bond pad 12 including a copper layer base 12' and a layer of metal 12" thereon for wire bonding purposes as described hereinbefore is illustrated. As illustrated in step 102, a substrate 11 as described hereinbefore for a semiconductor device 10 has a layer of copper or copper alloy deposited thereon using any desired deposition process. Subsequently, in step 104, a layer of metal 12" is deposited on the copper layer base 12' using any well-known deposition process. Then, instep 106, the copper layer base 12' and layer of metal 12" is patterned and etched to form the desired shape, number, and pattern for the bond pads 12 on the active surface 14 of the substrate 11 of the semiconductor device 10. A layer of insulating material 13 is typically applied to the active surface 14 of the substrate 11 to protect the circuitry formed thereon of the semiconductor device 10. After the completion of the semiconductor device 10 having bond pads 12 including a copper layer base 12' and layer of metal 12" thereon, the semiconductor device 10 may be assembled to a lead frame (not shown) for wire bonding a wire 20 to the bond pad 12 of the semiconductor device 10 using any suitable wire bonding process 108 and apparatus.

Figure 5B:
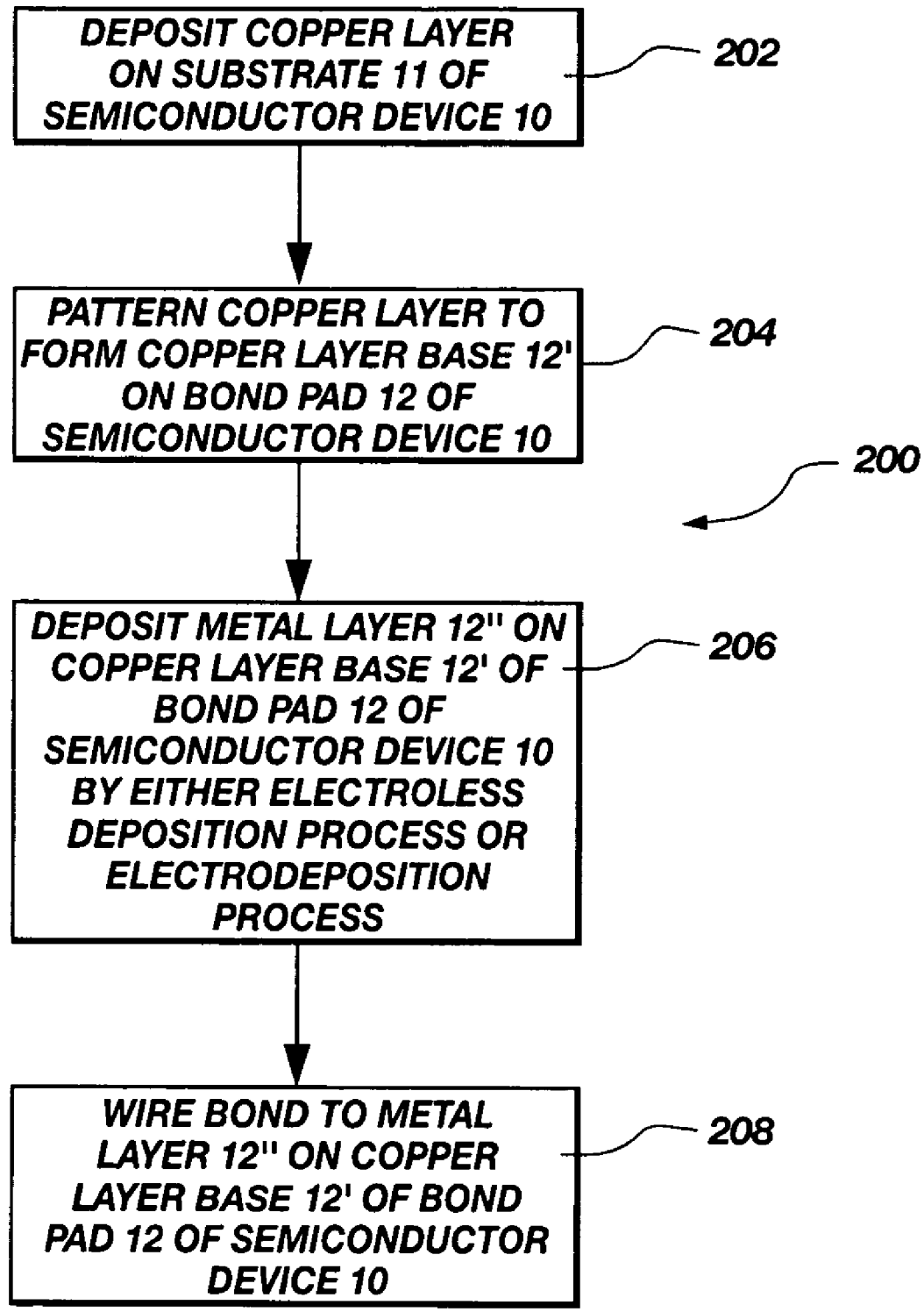

Referring to drawing FIG. 5B, a process 200 for the formation of a bond pad 12 including a copper layer base 12' and a layer of metal 12" thereon for wire bonding purposes as described hereinbefore is illustrated. As illustrated in step 202, a substrate 11 as described hereinbefore for a semiconductor device 10 has a layer of copper or copper alloy deposited thereon using any desired deposition process. Subsequently, in step 204, the copper layer base 12' is patterned and etched to form the desired shape, number, and pattern for the bond pads 12 on the active surface 14 of the substrate 11 of the semiconductor device 10. Then, in step 206, the layer of metal 12" is deposited on the copper layer base 12' using any desired deposition process, as described hereinbefore, such as electrodeposition, electroless deposition, etc., to form the bond pad 12 having a copper layer base 12' and layer of metal 12" thereon for good wire bonding properties. A layer of insulating material 13 is typically applied to the active surface 14 of the substrate 11 to protect the circuitry formed thereon of the semiconductor device 10. After the completion of the semiconductor device 10 having bond pads 12 including a copper layer base 12' and layer of metal 12" thereon, the semiconductor device 10 may be assembled to a lead frame (not shown) for wire bonding a wire 20 to the bond pad 12 of the semiconductor device 10 using any suitable wire bonding process 208 and apparatus.

Figure 5C:
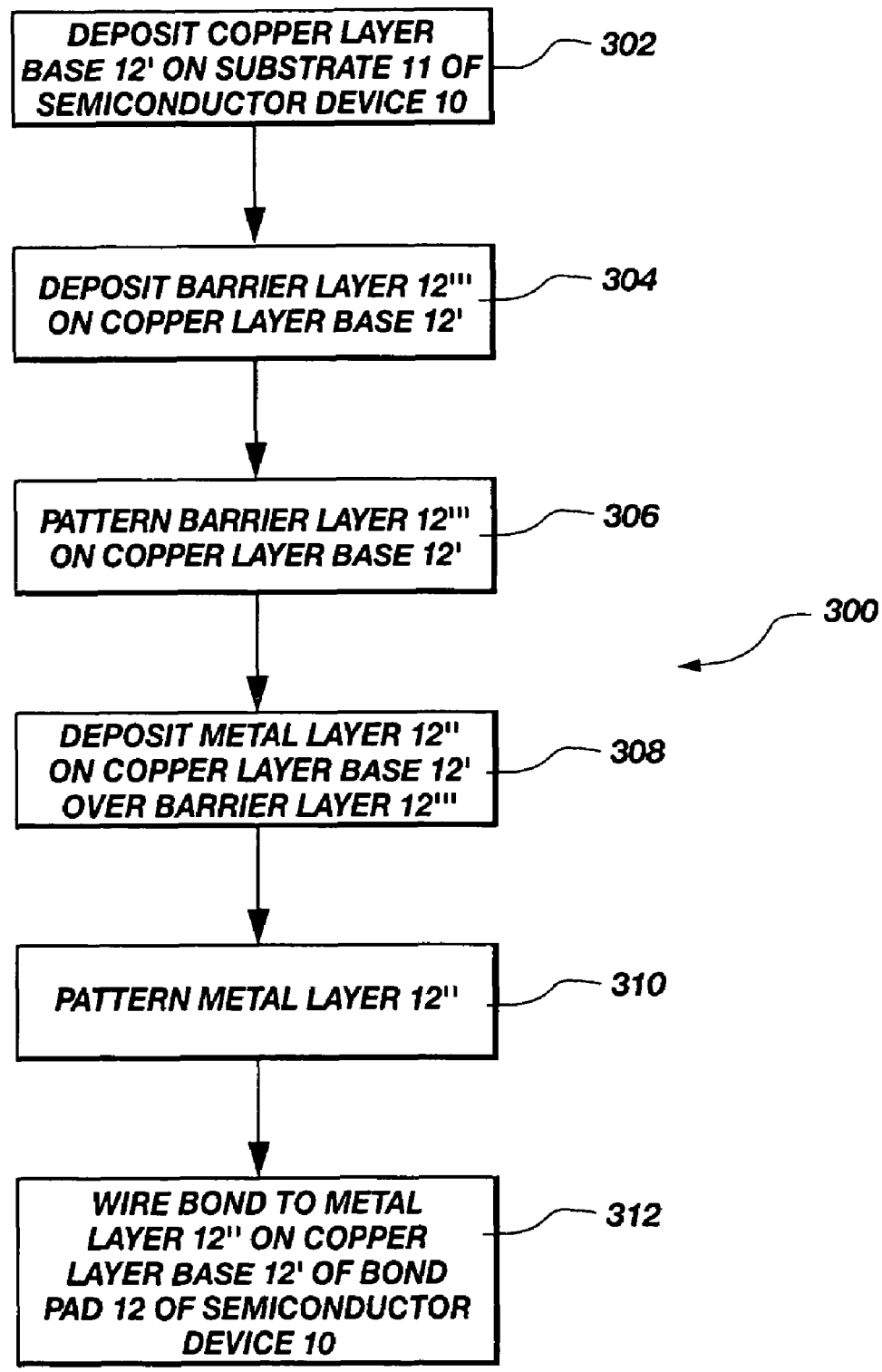

Referring to drawing FIG. 5C, a process 300 for the formation of a bond pad 12 including a copper layer base 12', a barrier layer 12''', and a layer of metal 12" thereon for wire bonding purposes as described hereinbefore is illustrated. As illustrated in step 302, a substrate 11 as described hereinbefore for a semiconductor device 10 has a layer of copper or copper alloy deposited thereon using any desired deposition process. Subsequently, in step 304, a barrier layer 12''' of suitable material is deposited on the copper layer base 12' using any well-known deposition process. Then, in step 306, the copper layer base 12' and barrier layer 12''' are patterned and etched to form the desired shape, number, and pattern for the bond pads 12 on the active surface 14 of the substrate 11 of the semiconductor device 10. Then a metal layer 12" is deposited in step 308 over the barrier layer 12''' and subsequently patterned in step 310. A layer of insulating material 13 is typically applied to the active surface 14 of the substrate 11 to protect the circuitry formed thereon of the semiconductor device 10. After the completion of the semiconductor device 10 having bond pads 12 including a copper layer base 12', barrier layer 12''', and layer of metal 12" thereon, the semiconductor device 10 may be assembled to a lead frame (not shown) for wire bonding a wire 20 to the bond pad 12 of the semiconductor device 10 using any suitable wire bonding process 312 and apparatus.

Figure 5D:
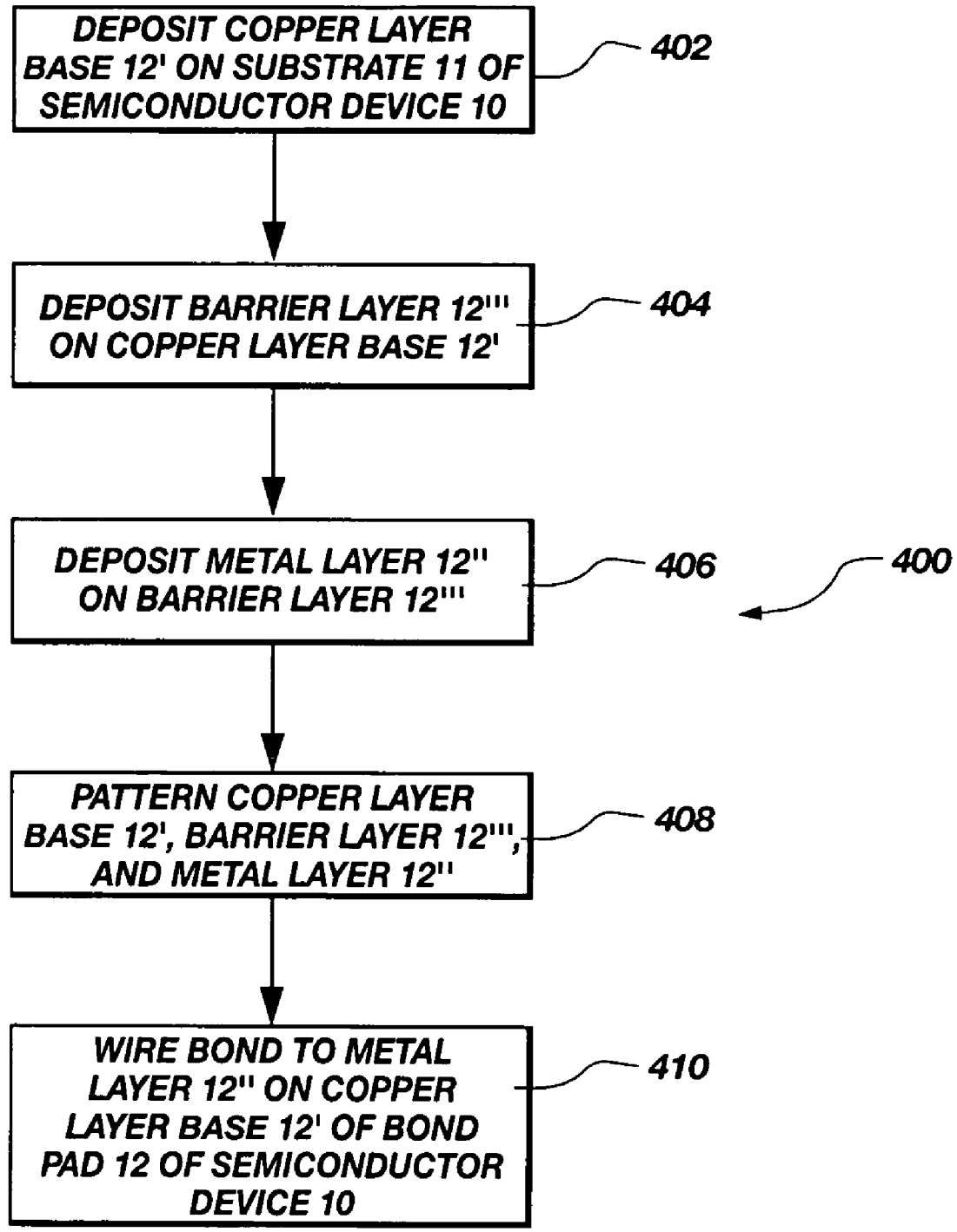

Referring to drawing FIG. 5D, a process 400 for the formation of a bond pad 12 including a copper layer base 12', a barrier layer 12''', and a layer of metal 12" thereon for wire bonding purposes as described hereinbefore is illustrated. As illustrated in step 402, a substrate 11 as described hereinbefore for a semiconductor device 10 has a layer of copper or copper alloy deposited thereon using any desired deposition process. Subsequently, in step 404, a barrier layer 12''' of suitable material is deposited on the copper layer base 12' using any well-known deposition process. Then, in step 406, a metal layer 12" is deposited on the barrier layer 12'''. In step 408, the copper layer base 12', barrier layer 12''', and metal layer 12" are patterned and etched to form the desired shape, number, and pattern for the bond pads 12 on the active surface 14 of the substrate 11 of the semiconductor device 10. A layer of insulating material 13 is typically applied to the active surface 14 of the substrate 11 to protect the circuitry formed thereon of the semiconductor device 10. After the completion of the semiconductor device 10 having bond pads 12 including a copper layer base 12', barrier layer 12''', and layer of metal 12" thereon, the semiconductor device 10 may be assembled to a lead frame (not shown) for wire bonding a wire 20 to the bond pad 12 of the semiconductor device 10 using any suitable wire bonding process 410 and apparatus.

Figure 5E:
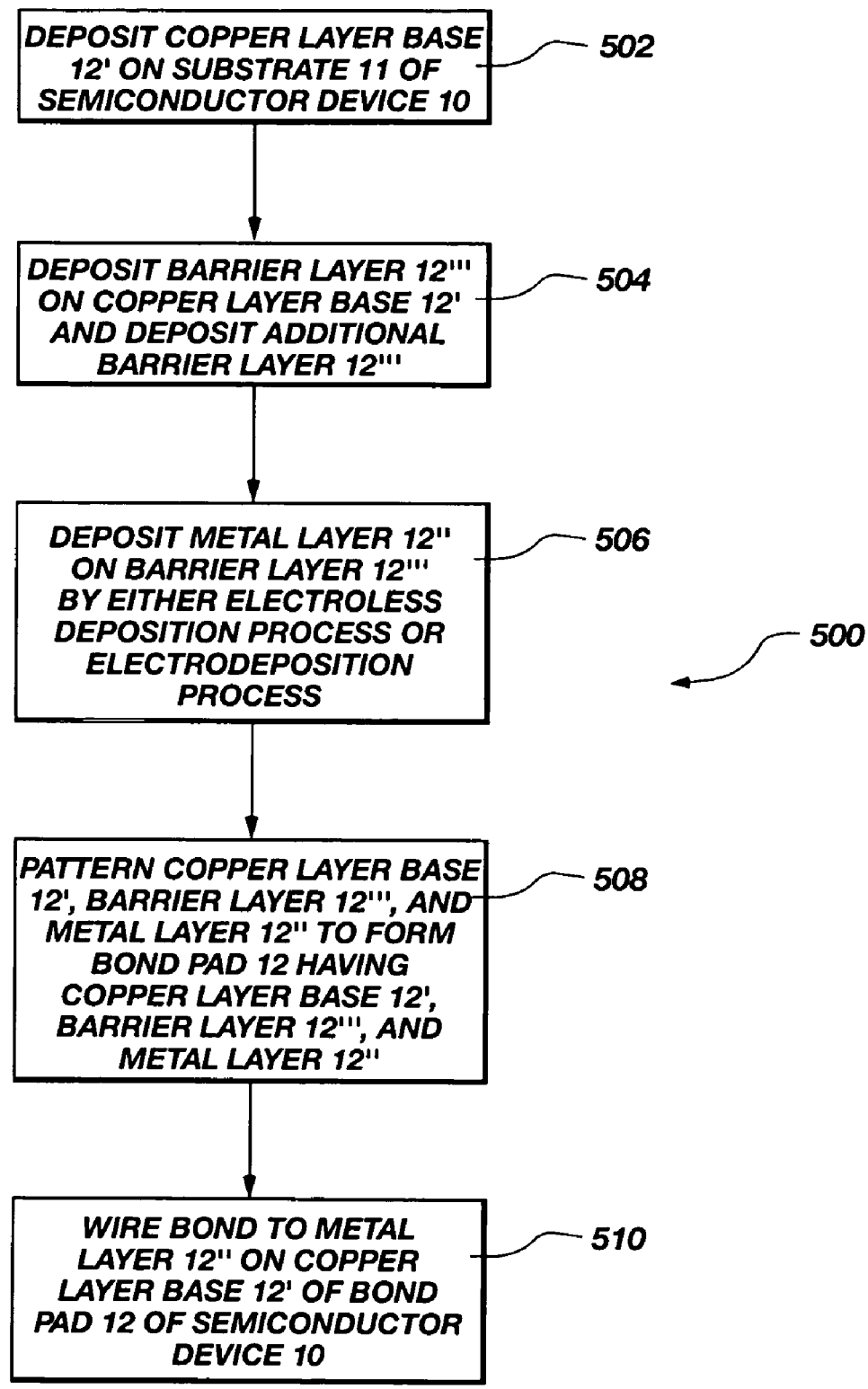

Referring to drawing FIG. 5E, a process 500 for the formation of a bond pad 12 including a copper layer base 12' and a layer of metal 12" thereon for wire bonding purposes as described hereinbefore is illustrated. As illustrated in step 502, a substrate 11 as described hereinbefore for a semiconductor device 10 has a layer of copper or copper alloy deposited thereon using any desired deposition process. Subsequently, in step 504, at least two barrier layers 12''' are deposited on the copper layer base 12'. In step 506, a metal layer 12" is deposited on the barrier layer 12''' using any desired deposition process, as described hereinbefore, such as electrodeposition, electroless deposition, etc. In step 508, the copper layer base 12', barrier layer 12''', and metal layer 12" are patterned to form the bond pad 12 having a copper layer base 12', barrier layer 12''', and layer of metal 12" thereon for good wire bonding properties. A layer of insulating material 13 is typically applied to the active surface 14 of the substrate 11 to protect the circuitry formed thereon of the semiconductor device 10. After the completion of the semiconductor device 10 having bond pads 12 including a copper layer base 12', at least two barrier layers 12''', and layer of metal 12" thereon, the semiconductor device 10 may be assembled to a lead frame (not shown) for wire bonding a wire 20 to the bond pad 12 of the semiconductor device 10 using any suitable wire bonding process 510 and apparatus.

Referring to drawing FIGS. 5F through 5J, the processes set forth therein are similar to those described regarding those illustrated in drawing FIGS. 5A through 5E, except that a conductive lead 23 of a TAB tape 21 is bonded to the bond pad 12 of the semiconductor device 10, rather than a wire bond being made to the bond pad 12 of a semiconductor device 10.

Figure 5F:
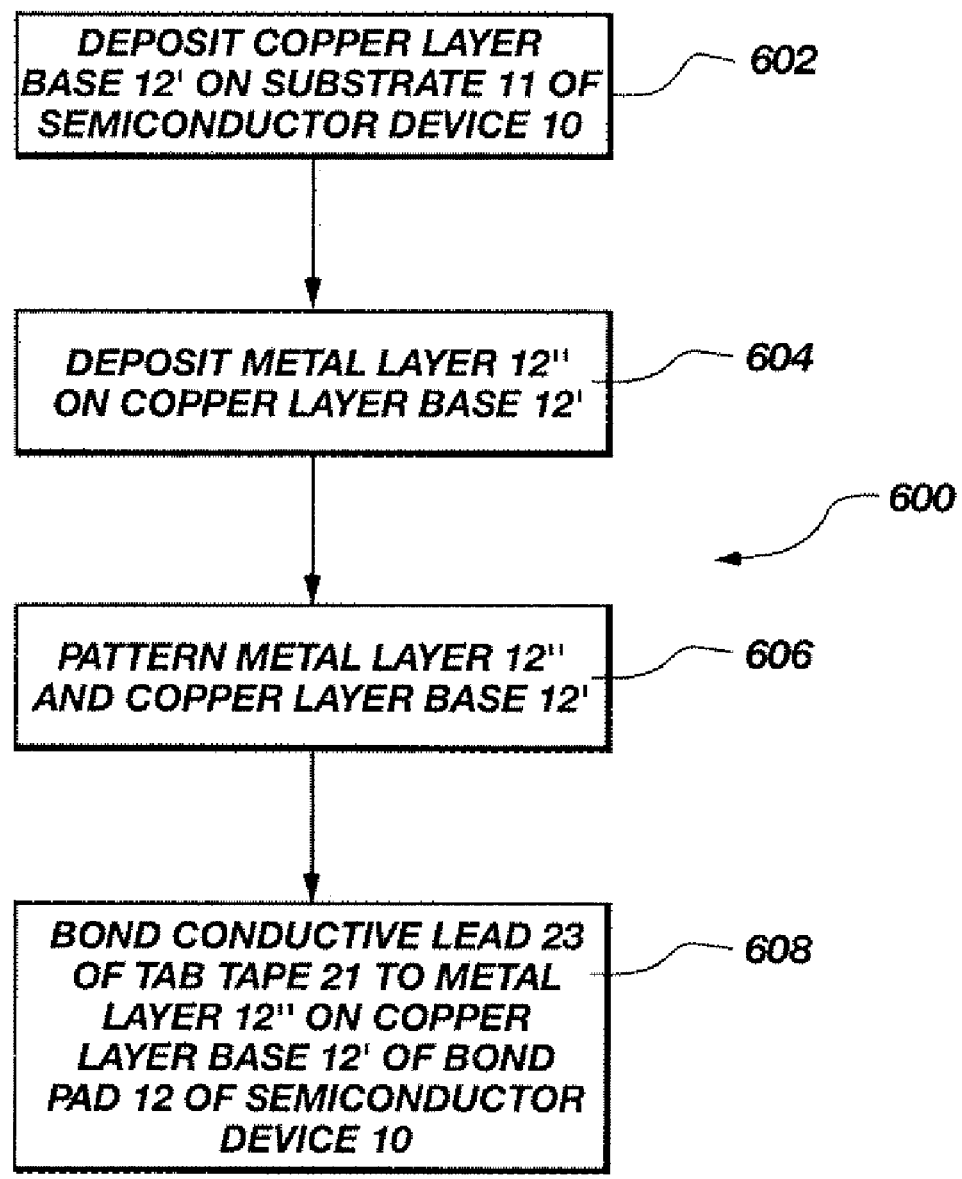

Referring to drawing FIG. 5F, a process 600 for the formation of a bond pad 12 including a copper layer base 12' and a layer of metal 12" thereon for conductive lead 23 of TAB tape 21 bonding purposes as described hereinbefore is illustrated. As illustrated in step 602, a substrate 11 as described hereinbefore for a semiconductor device 10 has a layer of copper or copper alloy deposited thereon using any desired deposition process. Subsequently, in step 604, a layer of metal 12" is deposited on the copper layer base 12' using any well-known deposition process. Then, in step 606, the copper layer base 12' and layer of metal 12" are patterned and etched to form the desired shape, number, and pattern for the bond pads 12 on the active surface 14 of the substrate 11 of the semiconductor device 10. A layer of insulating material 13 is typically applied to the active surface 14 of the substrate 11 to protect the circuitry formed thereon of the semiconductor device 10. After the completion of the semiconductor device 10 having bond pads 12 including a copper layer base 12' and layer of metal 12" thereon, the semiconductor device 10 may be assembled to a conductive lead 23 of a TAB tape 21 for bonding a conductive lead 23 to the bond pad 12 of the semiconductor device 10 using any suitable bonding process 608 and apparatus.

Figure 5G:
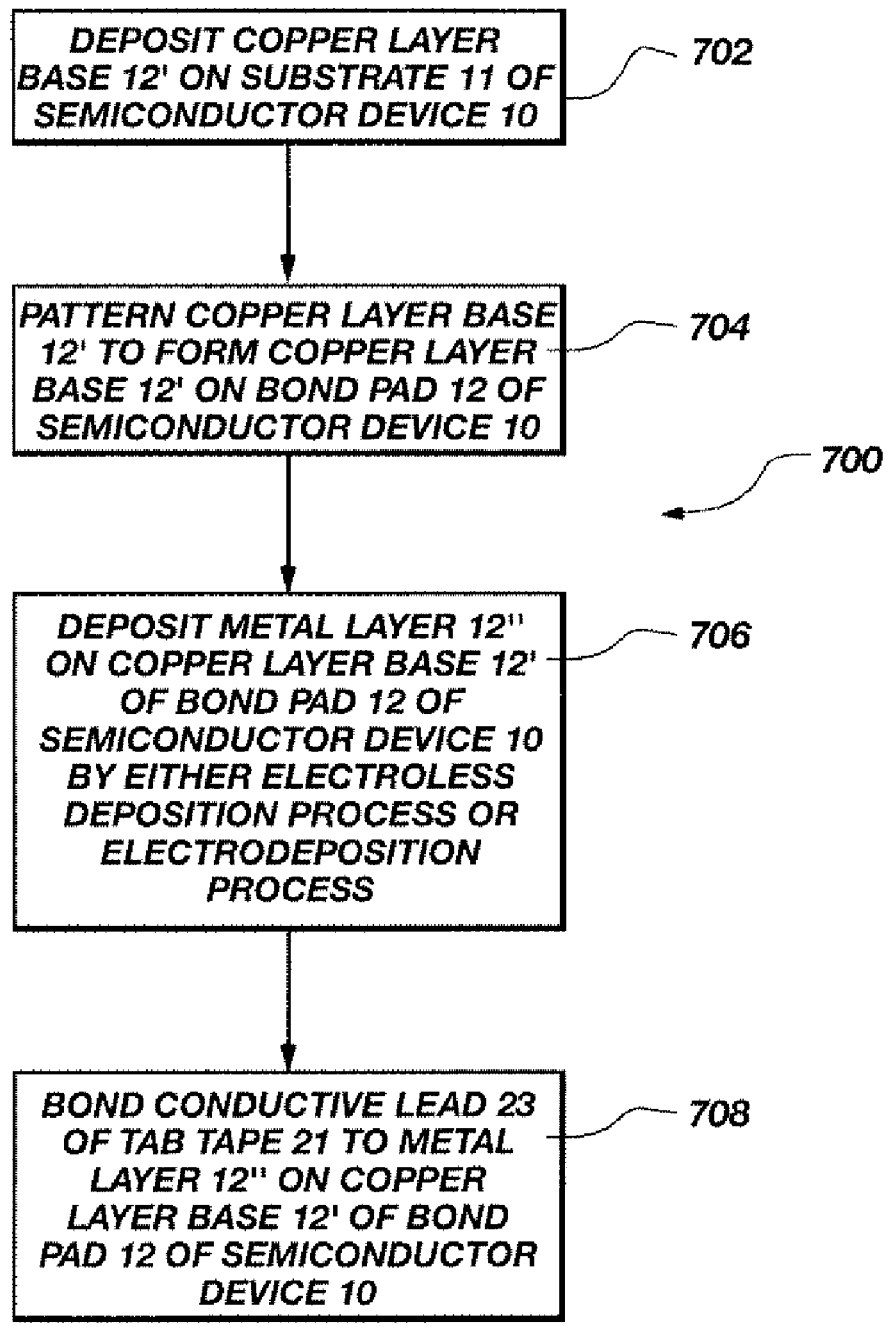

Referring to drawing FIG. 5G, a process 700 for the formation of a bond pad 12 including a copper layer 12' and a layer of metal 12" thereon for conductor lead of TAB tape bonding purposes as described hereinbefore is illustrated. As illustrated in step 702, a substrate 11 as described hereinbefore for a semiconductor device 10 has a layer of copper or copper alloy 12' deposited thereon using any desired deposition process. Subsequently, in step 704, the copper layer 12' is patterned and etched to form the desired shape, number, and pattern for the bond pads 12 on the active surface 14 of the substrate 11 of the semiconductor device 10. Then, in step 706, the layer of metal 12" is deposited on the copper layer 12' using any desired deposition process, as described hereinbefore, such as electrodeposition, electroless deposition, etc., to form the bond pad 12 having a copper layer 12' and layer of metal 12" thereon for good wire bonding properties. A layer of insulation 13 is typically applied to the active surface 14 of the substrate 11 to protect the circuitry formed thereon of the semiconductor device 10. After the completion of the semiconductor device 10 having bond pads 12 including a copper layer 12' and layer of metal 12" thereon, the semiconductor device may be assembled to a conductor lead of a TAB tape (not shown) for wire bonding a conductor lead to the bond pad 12 of the semiconductor device 10 using any suitable bonding process 708 and apparatus.

Figure 5H:
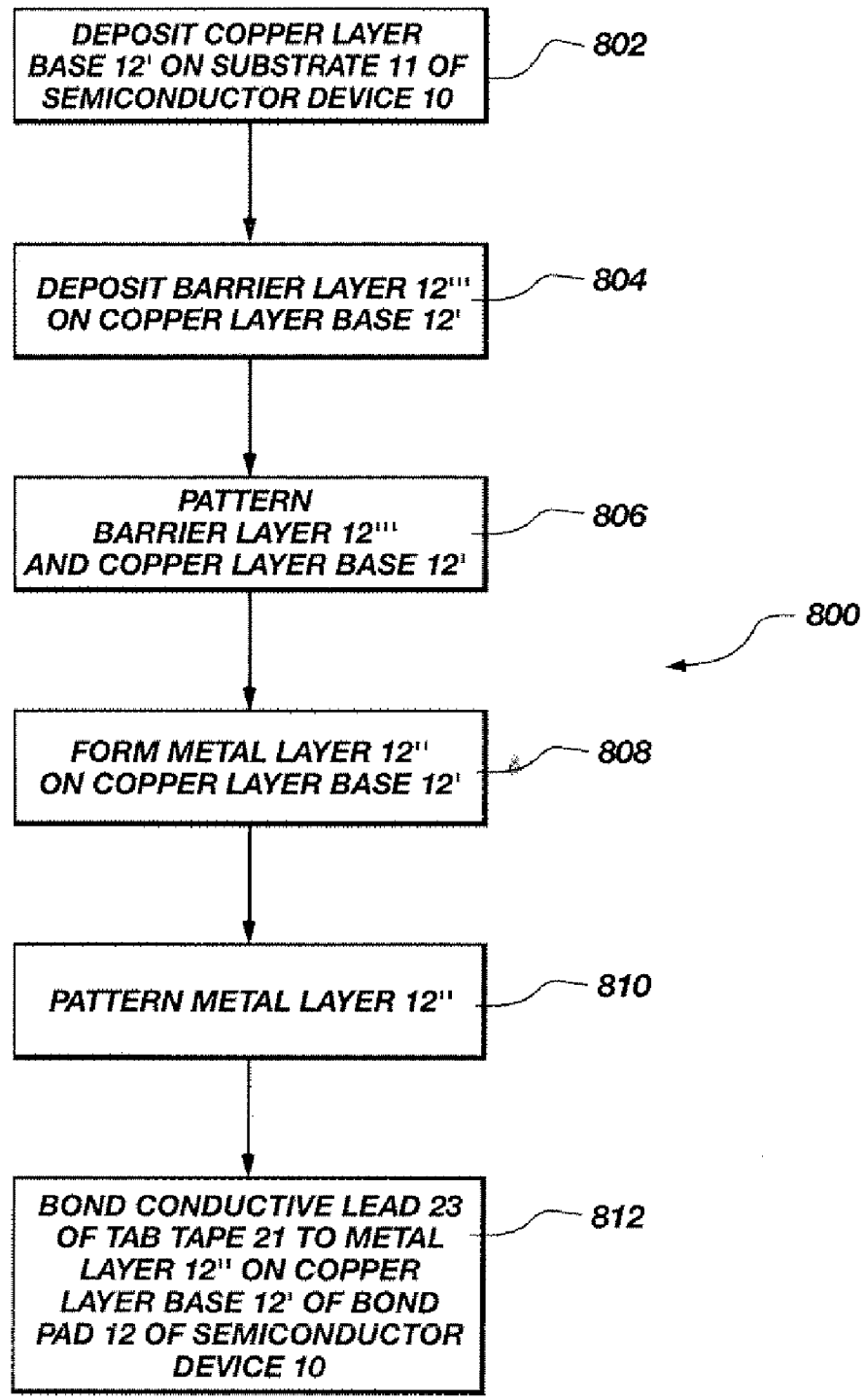

Referring to drawing FIG. 5H, a process 800 for the formation of a bond pad 12 including a copper layer base 12', a barrier layer 12''', and a layer of metal 12" thereon for conductive lead 23 of TAB tape 21 bonding purposes as described hereinbefore is illustrated. As illustrated in step 802, a substrate 11 as described hereinbefore for a semiconductor device 10 has a layer of copper or copper alloy deposited thereon using any desired deposition process. Subsequently, in step 804, a barrier layer 12''' of suitable material is deposited on the copper layer base 12' using any well-known deposition process. Then, in step 806, the copper layer base 12' and barrier layer 12''' are patterned and etched to form the desired shape, number, and pattern for the bond pads 12 on the active surface 14 of the substrate 11 of the semiconductor device 10. Then a metal layer 12" is deposited in step 808 over the barrier layer 12''' and subsequently patterned in step 810. A layer of insulating material 13 is typically applied to the active surface 14 of the substrate 11 to protect the circuitry formed thereon of the semiconductor device 10. After the completion of the semiconductor device 10 having bond pads 12 including a copper layer base 12', barrier layer 12''', and layer of metal 12" thereon, the semiconductor device 10 may be assembled to a conductive lead 23 of a TAB tape 21 for bonding a conductive lead 23 to the bond pad 12 of the semiconductor device 10 using any suitable bonding process 812 and apparatus.

Figure 5I:
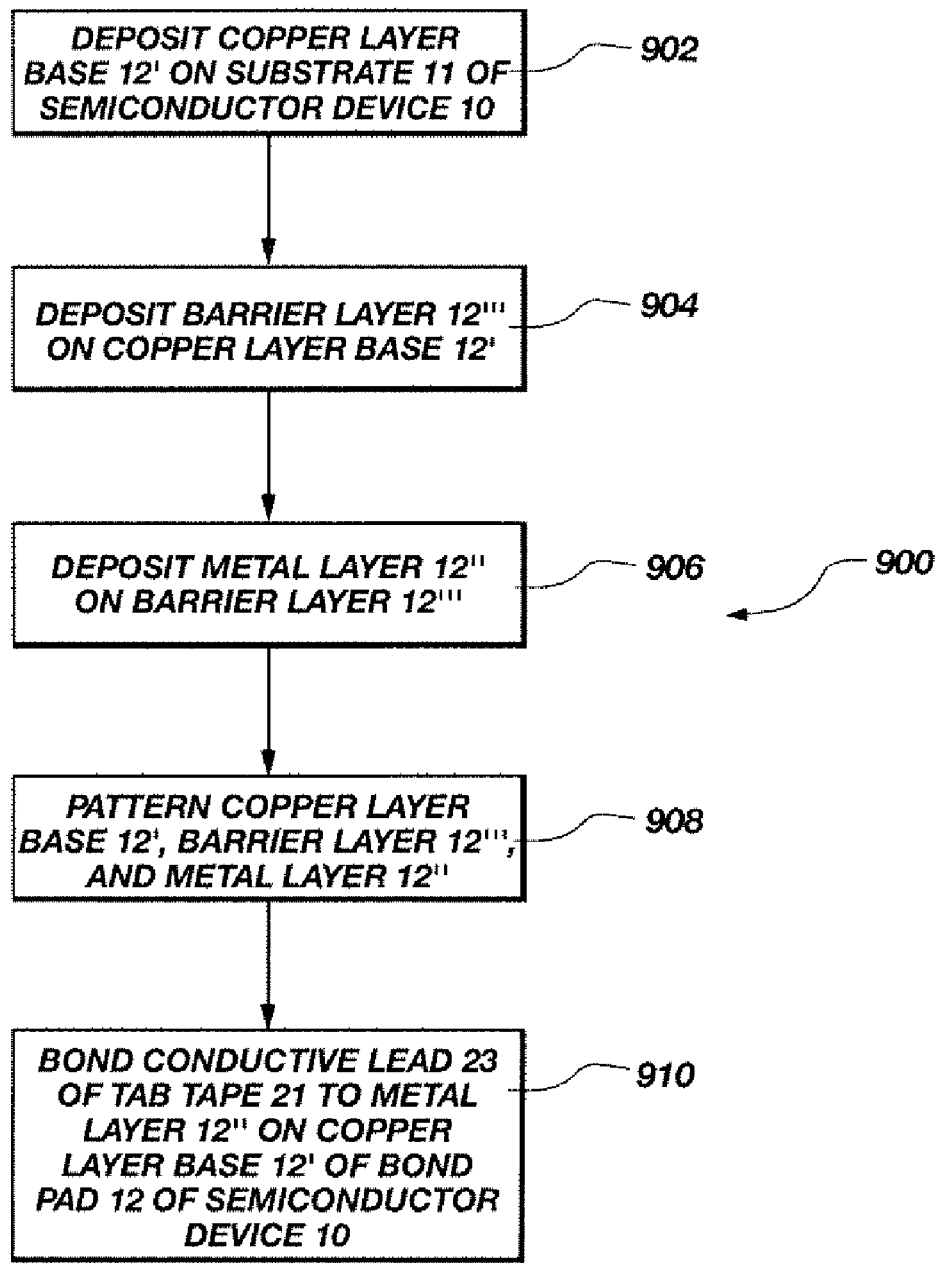

Referring to drawing FIG. 5I, a process 900 for the formation of a bond pad 12 including a copper layer base 12', a barrier layer 12''', and a layer of metal 12" thereon for conductive lead 23 of TAB tape 21 bonding purposes as described hereinbefore is illustrated. As illustrated in step 902, a substrate 11 as described hereinbefore for a semiconductor device 10 has a layer of copper or copper alloy deposited thereon using any desired deposition process. Subsequently, in step 904, a barrier layer 12''' of suitable material is deposited on the copper layer base 12' using any well-known deposition process. Then, in step 906, a metal layer 12" is deposited on the barrier layer 12'''. In step 908, the copper layer base 12', barrier layer 12''', and metal layer 12" are patterned and etched to form the desired shape, number, and pattern for the bond pads 12 on the active surface 14 of the substrate 11 of the semiconductor device 10. A layer of insulating material 13 is typically applied to the active surface 14 of the substrate 11 to protect the circuitry formed thereon of the semiconductor device 10. After the completion of the semiconductor device 10 having bond pads 12 including a copper layer base 12', barrier layer 12''', and layer of metal 12" thereon, the semiconductor device 10 may be assembled to a conductive lead 23 of a TAB tape 21 for bonding a conductive lead 23 to the bond pad 12 of the semiconductor device 10 using any suitable bonding process 910 and apparatus.

Figure 5J:
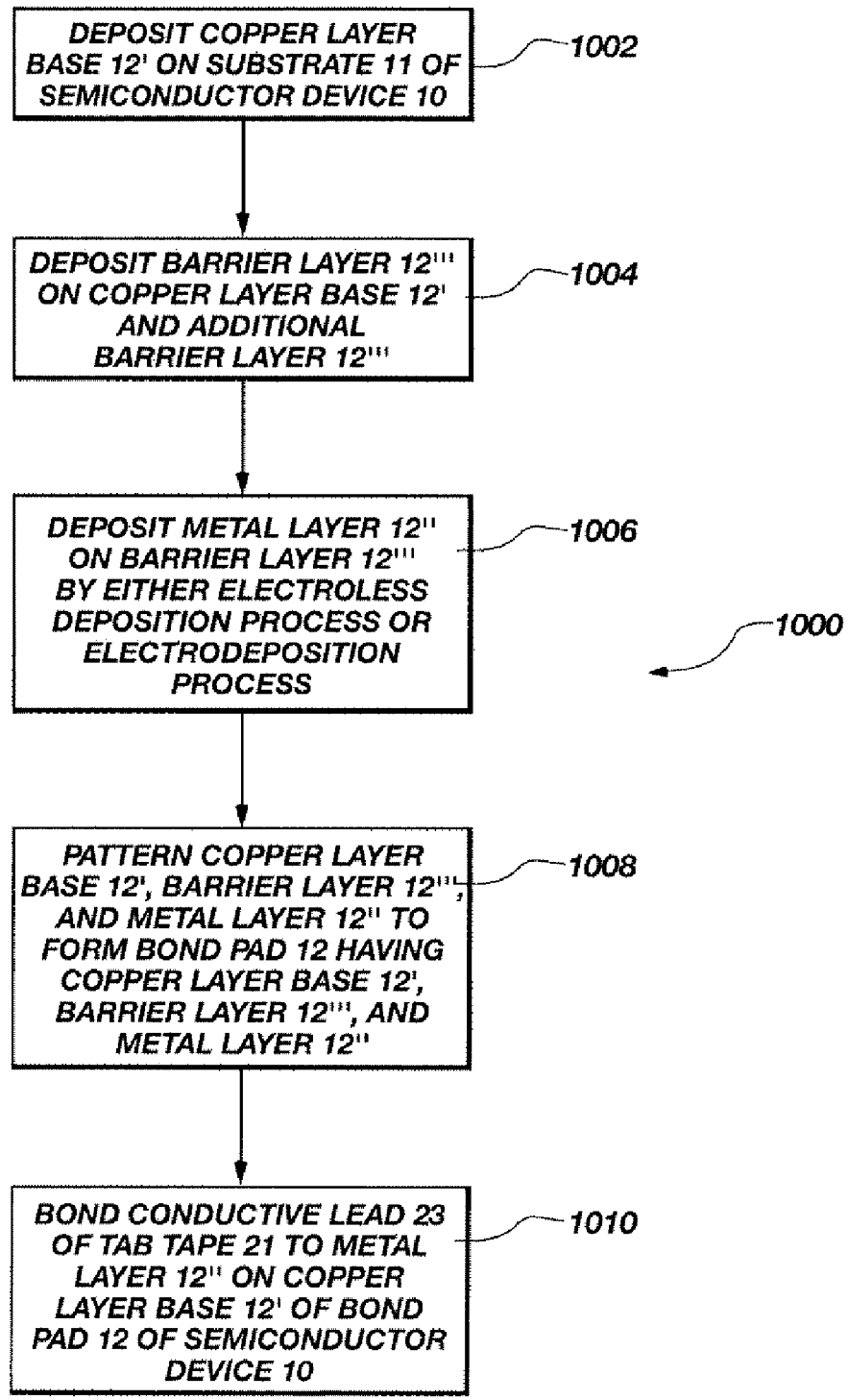

Referring to drawing FIG. 5J, a process 1000 for the formation of a bond pad 12 including a copper layer base 12' and a layer of metal 12" thereon for conductive lead 23 of TAB tape 21 bonding purposes as described hereinbefore is illustrated. As illustrated in step 1002, a substrate 11 as described hereinbefore for a semiconductor device 10 has a layer of copper or copper alloy deposited thereon using any desired deposition process. Subsequently, in step 1004, at least two barrier layers 12''' are deposited on the copper layer base 12'. In step 1006, a metal layer 12" is deposited on the barrier layers 12''' using any desired deposition process, as described hereinbefore, such as electrodeposition, electroless deposition, etc. In step 1008, the copper layer base 12''', barrier layer 12", and metal layer 12" are patterned to form the bond pad 12 having a copper layer base 12', barrier layers 12''', and layer of metal 12" thereon for good wire bonding properties. A layer of insulating material 13 is typically applied to the active surface 14 of the substrate 11 to protect the circuitry formed thereon of the semiconductor device 10. After the completion of the semiconductor device 10 having bond pads 12 including a copper layer base 12', barrier layer 12''', and layer of metal 12" thereon, the semiconductor device 10 may be assembled to a conductive lead 23 of a TAB tape 21 for wire bonding a conductive lead 23 to the bond pad 12 of the semiconductor device 10 using any suitable bonding process 1010 and apparatus.

It will be understood that changes, additions, deletions, and modifications may be made to the present invention which are intended to be within the scope of the claimed invention, such as the use of more than a single layer of metal over the copper layer to form a bond pad, the copper layer being multiple layers of differing materials, the barrier layer being multiple layers of differing materials, the metal layer being multiple layers of differing materials, etc.

What is claimed is:

1. A method of forming a semiconductor device assembly, said method comprising:
   providing a substrate having an upper surface and a lower surface;
   depositing a layer of copper on the upper surface and the lower surface of the substrate;
   patterning the layer of copper on at least one surface of the upper surface and the lower surface of the substrate to form at least one bond pad thereon;
   depositing at least one layer of metal on at least a portion of the layer of copper;
   connecting one end of a conductive lead of a TAB tape to the at least one layer of metal; and
   consuming a portion of the at least one layer of metal during the connecting of one end of a conductive lead of a TAB tape for connecting at least a portion of one end of the conductive lead of the TAB tape to at least a portion of the layer of copper.

2. The method of claim 1, further comprising:
   connecting one end of the conductive lead of the TAB tape to the at least one layer of metal using a wire bond.

3. A method of forming a semiconductor device assembly, said method comprising:
   providing a substrate having an upper surface and a lower surface;
   depositing a layer of copper on the upper surface and the lower surface of the substrate;
   patterning the layer of copper on both the upper surface and the lower surface of the substrate to form at least one bond pad thereon;
   depositing at least one layer of gold metal on at least a portion of the layer of copper;
   connecting one end of a conductive lead of a TAB tape to the at least one layer of gold metal; and
   consuming a portion of the at least one layer of gold metal during the connecting of one end of a conductive lead of a TAB tape for connecting at least a portion of one end of the conductive lead of the TAB tape to at least a portion of the layer of copper.

4. A method of forming a semiconductor device assembly having a substrate having an upper surface and a lower surface, said method comprising:
   depositing a layer of copper on the upper surface and the lower surface of the substrate;
   patterning the layer of copper on the upper surface and the lower surface of the substrate to form at least one bond pad thereon;
   depositing at least one layer of metal on at least a portion of the layer of copper;
   connecting one end of a conductive lead of a TAB tape to the at least one layer of metal; and
   consuming a portion of the at least one layer of metal during the connecting of one end of a conductive lead of a TAB tape for connecting at least a portion of one end of the conductive lead of the TAB tape to at least a portion of the layer of copper.

5. The method of claim 4, further comprising:
   connecting one end of the conductive lead of the TAB tape to the at least one layer of metal using a wire bond.

6. A method of forming a semiconductor device assembly having a substrate having an upper surface and a lower surface, said method comprising:
   depositing a layer of copper on more than one surface of the upper surface and the lower surface of the substrate;
   patterning the layer of copper on the upper surface and the lower surface of the substrate to form at least one bond pad thereon;
   depositing at least one layer of gold metal on at least a portion of the layer of copper; connecting one end of a conductive lead of a TAB tape to the at least one layer of gold metal; and
   consuming a portion of the at least one layer of gold metal during the connecting of one end of a conductive lead of a TAB tape for connecting at least a portion of one end of the conductive lead of the TAB tape to at least a portion of the layer of copper.

7. A method of forming a semiconductor device assembly having a substrate having an upper surface and a lower surface, said method comprising:
   depositing a layer of copper on more than one desired surface of one surface of the upper surface and the lower surface of the substrate;
   patterning the layer of copper on at least one surface of the upper surface and the lower surface of the substrate to form at least one bond pad thereon;
   depositing at least one layer of gold metal on at least a portion of the layer of copper;
   connecting one of an end of a conductive lead of a TAB tape and a portion of a bond wire to the at least one layer of gold metal; and
   consuming a portion of the at least one layer of gold metal during the connecting of one end of a conductive lead of a TAB tape for connecting at least a portion of one end of the conductive lead of the TAB tape to at least a portion of the layer of copper.

* * * * *

UNITED STATES PATENT AND TRADEMARK OFFICE
CERTIFICATE OF CORRECTION

PATENT NO. : 7,338,889 B2  Page 1 of 1
APPLICATION NO. : 10/791191
DATED : March 4, 2008
INVENTOR(S) : Akram It is certified that error appears in the above-identified patent and that said Letters Patent is hereby corrected as shown below:

In column 12, line 56, in Claim 7, after "one" delete "of an".

Signed and Sealed this

Tenth Day of June, 2008

JON W. DUDAS
*Director of the United States Patent and Trademark Office*